US006920625B2

(12) United States Patent
Gass

(10) Patent No.: US 6,920,625 B2
(45) Date of Patent: Jul. 19, 2005

(54) METHOD AND APPARATUS FOR OPTIMUM TRANSPARENT LATCH PLACEMENT IN A MACRO DESIGN

(75) Inventor: Robert Benjamin Gass, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 10/422,666

(22) Filed: Apr. 24, 2003

(65) Prior Publication Data

US 2004/0216064 A1 Oct. 28, 2004

(51) Int. Cl.$^7$ .............................................. G06F 17/50
(52) U.S. Cl. ............................... 716/10; 716/2; 716/5; 716/6; 716/11
(58) Field of Search .......................... 716/2, 5–6, 10–11

(56) References Cited

U.S. PATENT DOCUMENTS

| | | | | | |
|---|---|---|---|---|---|
| 5,883,814 | A | * | 3/1999 | Luk et al. ....................... | 716/2 |
| 5,886,904 | A | * | 3/1999 | Dai et al. ...................... | 703/14 |
| 6,158,022 | A | * | 12/2000 | Avidan ......................... | 714/33 |
| 6,536,024 | B1 | * | 3/2003 | Hathaway ...................... | 716/6 |

OTHER PUBLICATIONS

Saxena et al., "The Retiming of Single–Phase Clocked Circuits Containing Level–Sensitive Latches," IEEE, 1999, pp. 1–6.*

Burks et al, "Optimizing of Critical Path in Circuits with Level–Sensitive Latches," IEEE, 1994, pp. 468–473.*

* cited by examiner

Primary Examiner—Vuthe Siek
(74) Attorney, Agent, or Firm—Duke W. Yee; Casimer K. Salys; Wayne P. Bailey

(57) ABSTRACT

An apparatus and method for optimum transparent latch placement in a macro design are provided. With the apparatus and method, a tree graph data structure is generated to represent the design wherein nodes of the tree graph data structure represent macros of the design. Each node of the tree graph data structure is augmented to include a maximum latch number and a clocking domain. Any leaf nodes of the tree graph data structure that cannot have latches placed in them, but have latch placement requirements, have their latch placement requirements added to their parent node if their parent node has more than one child node. The tree graph data structure is traversed to find the most timing critical nodes with timing requirements that have not been satisfied. A most timing critical path of these paths is identified. Intermediate nodes along this path are examined to determine if there are any latch placement requirements that must be met for the nodes. If these nodes have associated latch placement requirements, the requirements are satisfied first. Then latch placement along the critical path is performed in accordance with a one or more project specific placement rules.

32 Claims, 5 Drawing Sheets

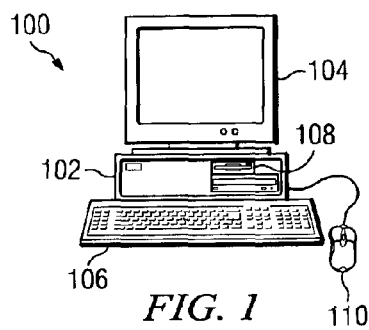
FIG. 1
| NODE DATA STRUCTURE | | |
|---|---|---|
| LATCH CAPABILITY ATTRIBUTE 310 | FIRST LATCH ATTRIBUTE 320 | LATCH NUMBER ATTRIBUTE 330 |
| DELAY ATTRIBUTE 340 | TOTAL DELAY ATTRIBUTE 350 | REQUIRED NUMBER OF LATCHES ATTRIBUTE 360 |
| RATE ATTRIBUTE 370 | REQUIREMENT MET ATTRIBUTE 380 | MAXIMUM LATCH NUMBER ATTRIBUTE 390 |
| 395  CLOCKING DOMAIN | | |
FIG. 3
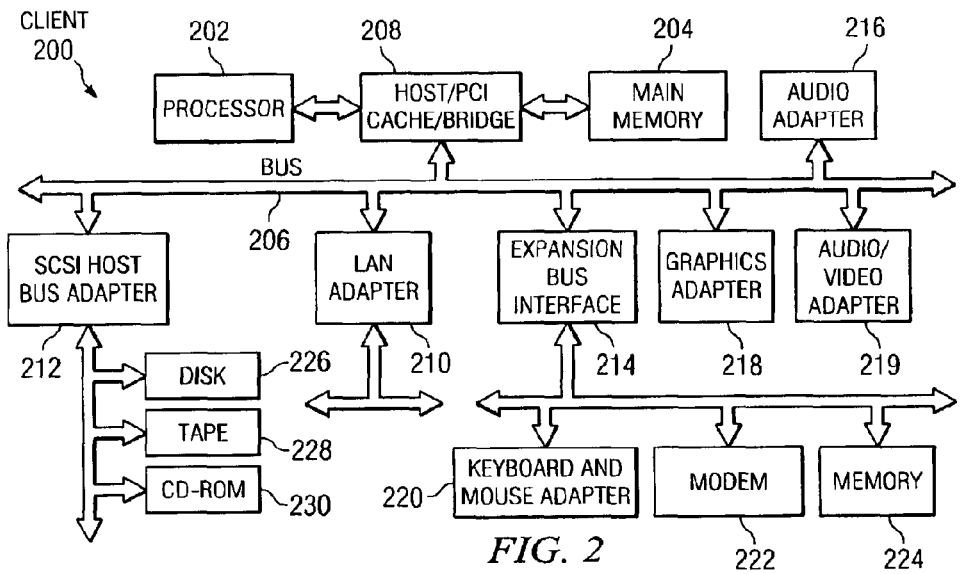
FIG. 2

METHOD AND APPARATUS FOR OPTIMUM TRANSPARENT LATCH PLACEMENT IN A MACRO DESIGN

BACKGROUND OF THE INVENTION

1. Technical Field

The present invention is directed to a method and apparatus for optimum transparent latch placement in a macro based chip design.

2. Description of Related Art

Flip-flop style latches have the disadvantage of only capturing and passing data form input to output during a small transition period of the clock. That is, flip flop style latches only store the data of a data signal as when the clock signal goes high. This is known as a transition sensitive latch. As a result, if a data signal gets to the latch before the capturing transition of the clock, the data signal waits until the next capturing transition of the clock before it is latched and time is wasted. This is known as clock gating. If the data signal arrives after the clock capturing transition, then functionality of the circuit is broken.

When testability is not a large issue, flip-flop style latches may be replaced with transparent latches to make timing critical paths more efficient. Transparent latches are often known as level sensitive latches. This type of latch will pass data from input to output anytime while the clock is high. As a result, there is a larger timing window for data to pass from input to output with transparent latches and the transparent latch is less likely to be clock gated.

Large multi-cycle buses provide a case where testability is not a large issue and flip-flop style latches may be replaced with transparent latches. With large multi-cycle buses, i.e. buses that are large enough that more than one timing cycle is required to traverse the entire bus, cycles must be spent as the data traverses the bus. With such bus designs, once a floor plan has been established, the transparent latches of the bus must be placed such that the most timing critical signals are not clock gated during traversal, yet have sufficient slack and scalability. For large multi-cycle, multi-fanout buses, this is not a trivial problem.

Performing transparent latch placement by hand is a time consuming and error prone process. If a designer takes the time to perform manual transparent latch placement, the latches for large groups of bits are typically placed identically.

That is, a bus is a group of signals which are associated. Usually, a bus is carrying a binary number from one section of the chip to another. Individual signals of the bus then are sometimes called a bit because they are transporting one bit of the binary number. Because the signals are all associated, they originate from the same source, or portion of the chip (i.e. the same macro), and are destined for the same portion of the chip, or sink. Therefore, the signals all travel through the same macros from the source to the various sinks.

To simplify the design process the designer will group the bits of the bus together and treat them all the same. That is, all the latches for each of the bits will be placed in the same macros. However, due to topology it is often better to place the latches for certain bits in different macros. Furthermore, treating all of the bits the same may cause some bits to become unnecessarily timing critical.

Some placement tools have been devised for placement of transparent latches. These tools are generally referred to as "place and route tools" and work at an application specific integrated circuit (ASIC) level of the design. Examples of some of these tools include Cadence, Silicon, Ensemble and Synopsis. Most placement tools work on a smaller scale inside of individual macros, i.e. blocks of integrated circuit elements that together perform a designated function, and do not work on a large high performance macro based chip scale.

Thus, it would be beneficial to have an apparatus and method that automatically performs optimum transparent latch placement in a design at a chip level.

SUMMARY OF THE INVENTION

The present invention provides an apparatus and method for optimum transparent latch placement in a macro based chip design. With the apparatus and method of the present invention, a tree graph data structure is generated to represent the design wherein nodes of the tree graph data structure represent macros of the design. Each node of the tree graph data structure is augmented to include a maximum latch number and a clocking domain. Any leaf nodes of the tree graph data structure that cannot have latches placed in them, but have latch placement requirements, have their latch placement requirements added to their parent node if their parent node has more than one child node.

The present invention traverses the tree graph data structure to find the most timing critical nodes with timing requirements that have not been satisfied. A most timing critical path of these paths is identified. Intermediate nodes along this path are examined to determine if there are any latch placement requirements that must be met for the nodes. If these nodes have associated latch placement requirements, these latch placement requirements are satisfied first. Then latch placement along the critical path is performed in accordance with a one or more project specific placement rules.

Once the latch placement requirements of the node of the critical path are satisfied, it is marked as such, and the nodes along the critical path are closed from further latch placement. Collateral nodes of the tree graph data structure are then examined to determine if they have their latch placement requirements satisfied by the latch placement in the critical path. If so, the nodes along these paths are also closed from further latch placement, and their latch placement requirements are marked as being satisfied.

A determination is then made as to whether any clock gating conditions are present at any of the nodes due to the latch placement. If so, then the tree graph data structure is split at the clock gated node and the above operation is repeated for the new tree graph data structure generated with the clock gated node being the root of the new tree graph data structure. Thereafter, the tree graph data structure is traversed to determine it all latch placement requirements have been met. If not, then latch placement in is performed on the remaining paths in the tree graph data structure in accordance with the above methodology.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is an exemplary diagram of a computing device in which the present invention may be implemented;

FIG. 2 is an exemplary block diagram of the operational components of a computing device in which the present invention may be implemented;

FIG. 3 is an exemplary block diagram of a node data structure in accordance with the present invention;

DETAILED DESCRIPTION OF THE PREFERRED EMBODIMENT

Figure 4:
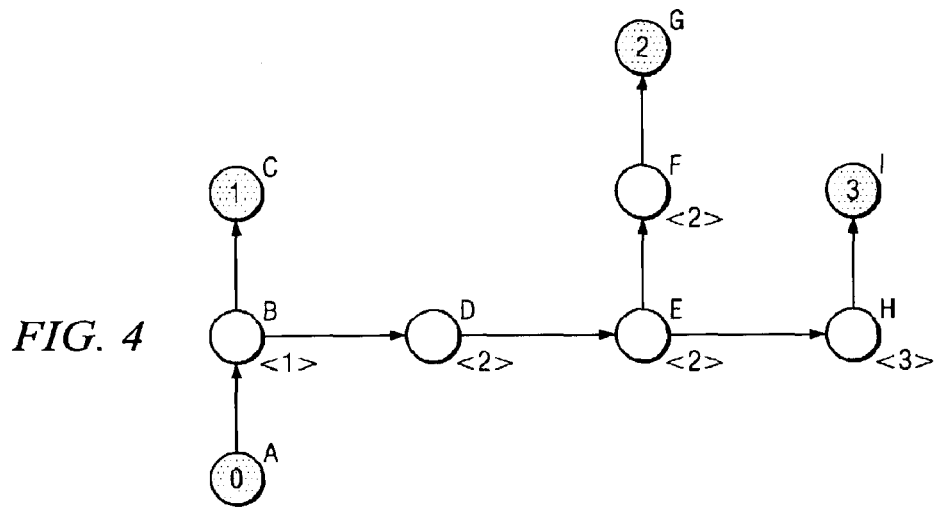
FIGS. 4–9 illustrate a tree graph data structure and the operations performed on this tree graph data structure in accordance with the present invention.

The present invention provides a mechanism for placement of transparent latches in a circuit design from a macro level. As such, the present invention is implemented in a computing device that is capable of taking circuit design data, generating a tree graph data structure from the circuit design data, and performing the transparent latch placement in accordance with the present invention as discussed hereafter. In order to provide a context for the execution environment of the present invention, FIGS. 1 and 2 are provided to describe a simplified representation of a computing device in which the present invention may be implemented.

With reference now to the figures and in particular with reference to FIG. 1, a pictorial representation of a data processing system in which the present invention may be implemented is depicted in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows XP, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

As mentioned previously, the present invention provides a mechanism for placement of transparent latches in a circuit design from a macro based chip level. With the mechanism of the present invention, the circuit design is first modeled as a tree graph data structure, such as an augmented directed acyclic graph (ADAG), in which each node of the tree graph data structure has only one parent node but may have more than one child node. Each node in the tree graph data structure represents a macro in the circuit design where latches may be placed. Each edge in the tree graph data structure indicates a data signal from the output of the preceding macro to the input of the macro the node represents.

With the present invention, a human designer is given a floor plan and latency requirements to each sink (destination) of the bus. This tells the designer where the macros are located that can be used for traversing the bus, where the source macro is, and where each of the sink macros are. Having obtained the floor plan and latency requirements, the topology is next determined (i.e. these bits of the bus will go through macros x, y, and z on there way to sink A). Once the designer has all of this information and the types of wires going between the macros are selected, delays between each of the macros for each of the bits can be determined through simulation and estimation, for example. A tree graph data structure is then built from the topology and delay information for each of the bits of the bus. The cycle time is also given and will be used to establish clocking domains. Once the tree graph data structure is built, the present invention is applied to the tree graph data structure as will be discussed hereafter.

The tree graph data structure may be obtained from a circuit design in any known manner, such as that briefly outlined above. Each node in the tree graph data structure has a plurality of attributes associated with it. FIG. 3 provides an exemplary diagram of a node data structure in accordance with the present invention. As shown in FIG. 3, the node data structure includes a latch capability attribute 310, a first latch number attribute 320, a last latch number attribute 330, a delay attribute 340, a total delay attribute 350, a required number of latches attribute 360, a rate attribute 370, a requirement met attribute 380, a maximum latch number attribute 390 and a clocking domain 395.

The latch capability attribute 310 is a Boolean value indicating whether the latches may be placed in the node. As mentioned previously, the nodes of the tree graph data structure represent macros that may or may not have areas where latches may be placed, as defined by the circuit design. This latch capability attribute 310 is set to true when the macro corresponding to the node has an area where latches may be placed and is set to false if the macro does not have an area where latches may be placed. Furthermore, during the course of placing latches nodes will have this value set to false to keep successive latch placements from using these nodes.

The first latch attribute 320 indicates the number of the first latch placed in the node. Multiple latches may be placed in the same node if the optimization provided by the present invention results in such placement being optimum. As such, the first latch attribute 320 identifies the latch number of the first latch placed in that particular node. Similarly, the last latch number attribute 330 indicates the number of the last latch placed in the node. This information is used to aid in placement of latches in the nodes of a path, as will be described hereafter. If a node does not have latches placed in it (nodes with latches placed in them may also be marked as closed from previous placement passes), then these attributes may be set to invalid values, such as −1, for example.

The delay attribute 340 identifies the delay from the parent node to this node. This delay attribute 340 is set based on an analysis of the circuit design and is representative of the delay a data signal will experience when being transmitted from the preceding node or parent node, to the current node.

The total delay attribute 350 identifies the total delay from the root node to this node. As discussed hereafter, the root node is a node that is considered to have the first numbered latch of the signal placed in it and is the source of the data signals for the tree graph data structure (As discussed herein below, after a tree graph data structure has been split due to clock gating the root node of the new tree graph data structure will not have a latch number of 0 placed in it). The total delay attribute 350 is a sum of the delays 340 for each node in the path traversed from the root node to the current node.

The required latches attribute 360 identifies a required number of the latch that must be placed in the path before this node. The required number of latches may be determined based on the circuit design based on architectural and physical design issues. For the purposes of the present invention, the number of latches is considered to be provided by the designer prior to operation of the present invention.

The required number of latches is used by the present invention in determining placement of latches within timing critical paths of the tree graph data structure. Again, as discussed herein below, after the a tree graph data structure has been split the root node of the new graph may have a latch number of 3 so if latches are being placed to a node with a latch placement requirement of latch number 5 there will only be 3 latches in the new tree graph data structure on the path to that node (counting the root node latch). However, in the composite of the new tree graph data structure and its remaining old tree graph data structure, there will be a total of 5 latches placed from root to that node.)

The rate attribute 370 is an indication of timing criticality. The rate attribute 370 may be calculated by dividing the total delay 350 by the latch placement requirement number of the node. Nodes without latch placement requirements do not need a valid rate value, as only nodes with latch placement requirements are used to prioritize paths. Alternatively, the rate attribute 370 may be calculated by dividing the required number of transparent latches by the total delay 350. The rate attribute 370 is used to compare nodes with latch placement requirements to determine the most timing critical paths in the tree graph data structure, as described hereafter.

The requirement met attribute 380 is a Boolean attribute that identifies whether the latch placement requirements of the node have been met by the transparent latch placement mechanism of the present invention. Once a node's latch placement requirements have been met, this attribute is set to true.

The maximum latch number attribute 390 identifies the maximum latch number that can be placed in this node. This attribute is determined based on successive nodes that have latch placement requirements. For any node x, the node's maximum latch number attribute value is set to the minimum latch placement requirement value of any of its descendent nodes with latch placement requirement values. The maximum latch number attribute 390 is used to determine the maximum latch value that can be place in that node. If a latch of greater value is forced to be placed in that node, then an error is generated and the latch placement requirements of the tree graph data structure cannot be satisfied.

The clocking domain 395 indicates the highest latch number that may be placed in the corresponding node without causing a clock gating condition at the node. The use of the clocking domain 395 is described in greater detail hereafter.

A separate node data structure, such as that described in FIG. 3, is provided for each node of the tree graph data structure. These node data structures are used by the present invention to perform transparent latch placement. The node data structures may include other information in addition to, or in replacement of, the attributes illustrated in FIG. 3 without departing from the spirit and scope of the present invention. Such other information may include information that is used to link parent nodes to child nodes and enable traversal of the tree graph data structure.

The basic approach of the mechanism of the present invention is to identify the path with the most critical latch placement requirement, e.g., the most timing critical path of the tree graph data structure, and perform latch placement in this path first in accordance with the nodal latch placement requirements and then to perform latch placement as needed in the remaining paths. The most critical path is found by investigating the rate attributes 370 of the nodes with latch placement requirements. The node with the largest value, if the rate is calculated by dividing the total delay by the required number of latches, or the smallest value, if the rate is calculated by dividing the required number of latches by the total delay, is the most critical path because it has the largest delay per latch. This means that the data signals must travel further between each latch. These most critical paths have latches placed in them first to ensure these paths have the most effective latch placement. The remaining paths to nodes with latch placement requirements are given latches where they are needed.

With the present invention, once a tree graph data structure such as that defined above is generated based on a circuit design, latch placement is performed. The first operation of latch placement in accordance with the present invention is to traverse the graph and augment each node with a maximum latch number, i.e. to set the value for the maximum latch number 390 in each node.

The maximum latch number value for each node may be obtained, for example, by performing a recursive traversal of the tree graph data structure Using the recursive traversal of the tree graph data structure, the maximum latch number attribute value is set to be the minimum latch placement requirement value of any of that node's dependent nodes. Example pseudo-code for performing such a recursive traversal is provided as follows:

```
Maxlatch {
    If current node has latch placement requirement {
        Set its max value to its latch placement
            requirement value;
        Return the latch placement requirement value;
    }
    Else {
```

-continued

```
        Val = 99999999;
        For each successor node (of the current node)
            Nextval = successor->Maxlatch;
            If   (Val > Nextval) {
                Val = Nextval;
            }
        }
    }
    This nodes max value = Val;
    Return Val
    }
}
```

After having augmented each node of the tree graph data structure with the maximum latch number, the graph is traversed to determine if latch placement requirements must be propagated from the leaf nodes to parent nodes of the leaf nodes. That is, if there are latch placement requirements in leaf nodes where latches cannot be placed, these latch placement requirements are propagated to the parent node of the leaf node if the parent node has more than one child node. In this way, the latch placement requirement of the leaf node must now be satisfied by the parent node.

Having modified the latch placement requirements as necessary, each node of the tree graph data structure is augmented with a clocking domain 395. The clocking domain 395 for each node may be calculated based on the total delay for the node and a cycle timing. For example, the clocking domain 395 may be calculated by dividing the total delay by ½ the cycle time (assuming a 50% duty cycle), rounding down, and adding the latch value of the root node. As an example, if the total delay to a node is 30 ns and the cycle timing is 10 ns, then the clocking domain 395 for the node is 6.

The clocking domain 395 indicates the highest latch number that may be placed in the corresponding node without causing a clock gating condition at the node. Thus, clocking domain 395 does not force the maximum latch number to be the same as the clocking domain 395, but rather provides a value that may be used to compare to the highest latch number placed in the node to determine if a clock gating condition is present.

Once the nodes of the tree graph data structure are augmented by the clocking domain, the most timing critical path is identified. This path is identified by examining the rate attribute for each of the nodes in the tree graph data structure with latch placement requirements. It will be assumed for simplicity of discussion that the rate attribute is calculated by dividing the required number of latches by the total delay of the leaf node. Thus, the smallest rate value indicates the most timing critical path.

Once the most timing critical path is identified spacing value is calculated such that the spacing of the placement of latches would evenly divide the total delay between the latches. Then, each of the intermediate nodes along the path are examined. If any of them have a latch placement requirement of their own that is not already satisfied, this latch placement requirement must be satisfied first. However, the spacing value calculated by the most critical node will be used to place latches for the intermediate node with the latch placement requirement.

That is, the first latch to be placed will be placed in a node with a total delay as close to the latch's multiple of the spacing value as possible. Each of the successive latches are placed in the same way until either the latch of the intermediate node's latch placement requirement has been placed or the multiple of the spacing value for the next latch to be placed is greater than or equal to the total delay of the intermediate node with the latch placement requirement.

Then, all remaining latches up to the intermediate node's latch placement requirement are placed in the node with the latch placement requirement itself. If the intermediate node cannot have latches placed in it then the remaining latches are placed in the first open preceding node that may have latches placed in it.

Having satisfied the intermediate node's latch placement requirements, the operation continues it not all of the latches for the highest priority, or critical, node's latch placement requirement have been placed. The continued operation of the present invention will still find the same node as the highest priority, or most critical node, and continue placing latches for that node. If no intermediate nodes to the most critical node have unsatisfied requirements all the latches to the critical node are placed. Otherwise, the placement of latches continues based on evenly distributing the delay between latches.

During placement for any node it is not likely that a node with a total delay exactly equal to the latch's multiple of the spacing value exists, so project specific rules can be used to select between the two closest open nodes depending on whether timing or area is more important. If timing is more important then the node with the greater delay may be chosen if the difference between its total delay and the multiple of the spacing value is not more than a certain percentage of the delay separating the two open nodes. If area is more important then the node with the lesser total delay is chosen if the difference between its total delay and the multiple of the spacing value is not greater than a certain percentage of the delay between the two open nodes. If the chosen node has a maximum latch number value less than the latch being placed, the next successive open latch with a max latch value greater than or equal to the value of the latch being placed is chosen.

Once the node's latch placement requirements have been satisfied by the above process, the nodes of the path to the node with the latch placement requirement, and the node with the latch placement requirement are marked as closed so that no further latch placement may be performed on these nodes. That is, the nodes of the path have their latch capability attribute set to false so that no further latch placement may be made to these nodes. Nodes that had their latch placement requirements met by the latch placement process above have their latch placement met attributes set to true. The tree graph data structure is then traversed to determine if any collateral nodes have their latch placement requirements met by the latch placement. If so, then these collateral nodes have their latch placement requirement met attributes set to true and both they and their intermediate nodes have their latch capability attributes set to false.

The path where latches were placed is then traversed to determine if there are any clock gatings due to the latch placement described above. That is, the largest latch number of the latches placed in the node is compared to clocking domain for that node. If the largest latch number of the latches is greater than the clocking domain, then a clock gating condition is present with regard to that node. The tree graph data structure is then split at the node with the clock gating thereby creating a new tree graph data structure with the node having the clock gating being the root node of the new tree graph data structure. The above process is then repeated for this new tree graph data structure as if it were a completely separate and new tree graph data structure.

After performing the above operations, the tree graph data structure is traversed to determine if all nodes that have latch placement requirements have had their requirements met. If not, the path with the next most critical timing path is identified and the process above is repeated for this next most critical timing path.

The above operations are illustrated in example tree graph data structure shown in FIGS. 4–9. As shown in FIG. 4, a tree graph data structure is generated from a circuit design in the manner discussed above. Each node in the tree graph data structure is represented by a node data structure such as that shown in FIG. 3. As illustrated, some nodes have their latch capability attributes set to false, i.e. indicating that they cannot have latches placed in them. These nodes are shown in FIGS. 4–9 as shaded nodes A, C, G and I. In addition, the leaf nodes C, G and I have latch placement requirements 1, 2 and 3, respectively. Node A is the root node and is considered to have latch 0 which is the source of the data signals for the tree graph data structure.

The intermediate nodes B, D, E, F and H have their latch capability attributes set to true so that latches may be placed in these intermediate nodes. In the depicted example, for simplicity of the description, it is assumed that the time delay between any two nodes is 10 ms.

As an initial operation of the present invention, the intermediate nodes are augmented by a maximum latch number (shown in "<>"). The maximum latch number for the leaf nodes is determined by the latch placement requirement of the leaf node. The maximum latch number is determined, for example, using a recursive traversal of the tree graph data structure, as discussed previously. Thus, for example, since the G leaf node has a latch placement requirement of 2, the maximum latch number for the intermediate nodes along the path from node A to node G are set based on this latch placement requirement. That is, node F has a maximum latch number of 2 and nodes D and E has a maximum latch number of 2. Node B has a maximum latch number of 1 because it is also in the path from the root node A to the leaf node C which has a latch placement requirement of 1.

Figure 5:
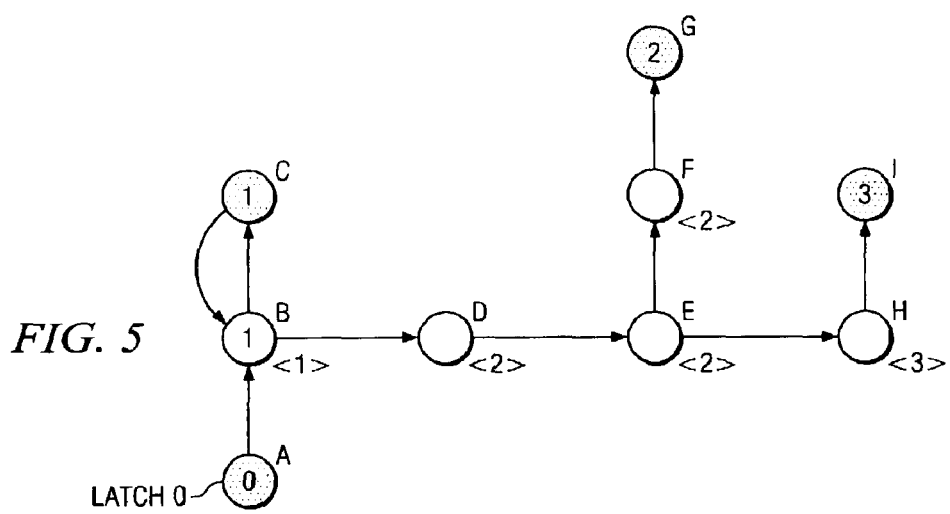

FIG. 5 illustrates a second operation of the present invention. Having established the maximum latch number for the nodes of the tree graph data structure, the tree graph data structure is traversed to determine if any of the latch placement requirements cannot be met in the leaf nodes. That is, if there is a leaf node that has latch placement requirements and the leaf node does not allow latches to be placed in it, i.e. the latch capability attribute is false, then the latch placement requirement must be satisfied in the leaf node's parent node if the parent node has more than one child node. As a result, some latch placement requirements of leaf nodes may be added to the parent nodes of the leaf nodes.

As shown in FIG. 5, the leaf node C has a latch placement requirement of 1. However, latches may not be placed in the leaf node C. The parent node B of leaf node C has more than one child node (nodes C and D) and thus, the latch placement requirement of node C is added to parent node B, as illustrated by the arrow going from node C to node B.

The leaf nodes G and I also do not allow latches to be placed in them. However, the parent nodes F and H, respectively, of leaf nodes G and I do not have a plurality of child nodes. Thus, the leaf node latch placement requirement is not added to the parent nodes F and H. The process of determining if latch placement requirements of leaf nodes needs to be moved or added to parent nodes of leaf nodes is referred to as "fixing" the tree graph data structure.

Figure 6:
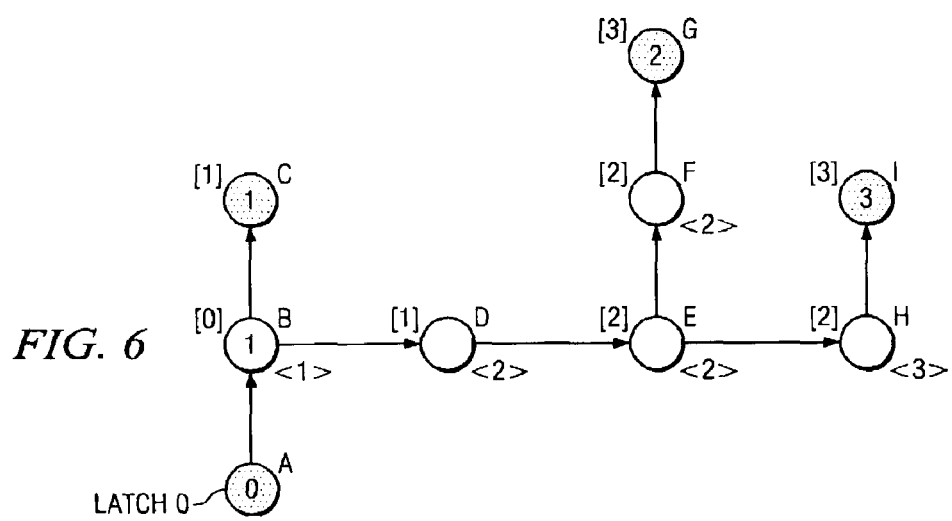

Having fixed the tree graph data structure, a next operation of the present invention, as shown in FIG. 6, is to augment each node of the tree graph data structure with a clocking domain. The clocking domain may be determined by dividing the total delay by ½ the cycle time, rounding down, and adding the value of the root latch. Thus, the clocking domain, shown in "[]" in FIG. 6, for node B is 0, the clocking domain for node C is 1, the clocking domain for node D is 1, the clocking domain for node E is 2, the clocking domain for node F is 2, the clocking domain for node G is 3, the clocking domain for node H is 2 and the clocking domain for node I is 3.

Figure 7:
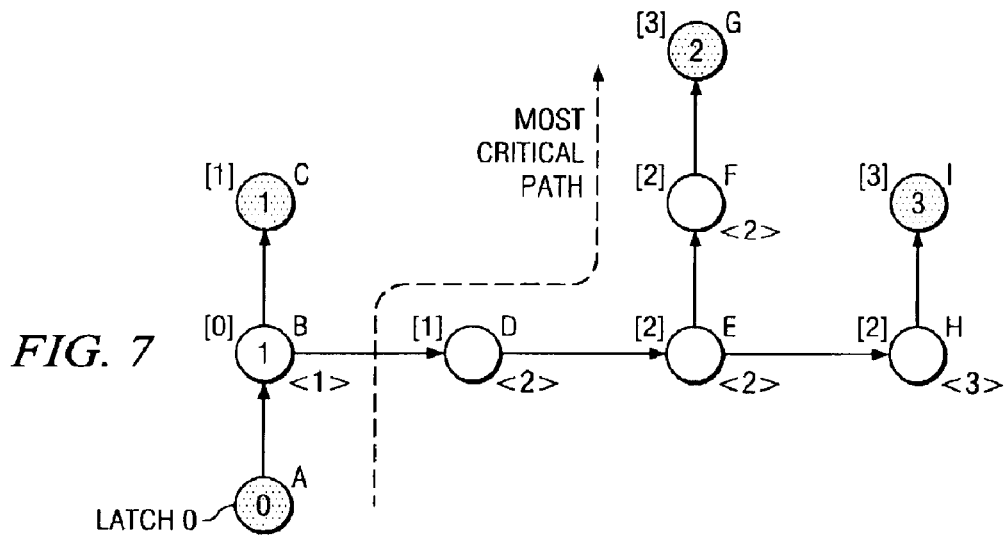

Thereafter, as shown in FIG. 7, the most critical path is identified. In a preferred embodiment, the most critical path is identified by dividing the latch placement requirement, for each node with a latch placement requirement, by the total delay for the path from the root node A to that node. The resulting value is the rate attribute of the node. Thus, by examining the rate attribute for each node with a latch placement requirement, a determination may be made as to which leaf node is in the most critical path, i.e. the smallest rate attribute value identifies the leaf node in the most critical path.

For example, the rate value for leaf node C is 1/20 (assuming the delay between nodes is 10 ns), and thus, the rate is 0.05 latches/ns. The rate value for leaf node G is 2/50 or 0.04 latches/ns. The rate value for leaf node I is 3/50 or 0.06 latches/ns. The rate value for node B is 1/10 or 0.1. Thus, comparing the rate values for these nodes, the smallest rate value is 0.04 latches/ms associated with leaf node G. In essence, this value indicates that there is a larger delay between latches in the path to node G than in the other paths. As a result, the most critical path is determined to be the path from the root node A to the leaf node G.

Having identified the most critical path in the tree graph data structure, the most critical path is traversed to determine if there are any intermediate nodes along the path that have their own latch placement requirements. These latch placement requirements are satisfied first before satisfying the latch placement requirement of leaf node G.

Figure 8:
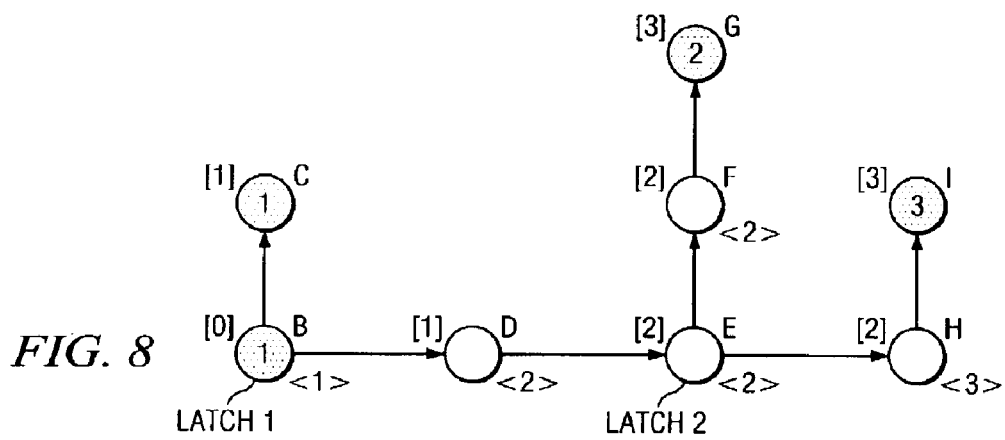

As shown in FIG. 8, node B has a latch placement requirement of 1, obtained from the fixing of the graph performed and discussed above with regard to FIG. 5. This latch placement requirement must be satisfied prior to satisfying the latch placement requirement of leaf node G. The spacing value to node G is calculated to be total delay/((the latch placement requirement−the root latch number)+1) which in this case is 50/(2−0+1)=16.67. The first latch that must be placed is 1 plus the value of the last latch placed in the path to the node with the latch placement requirement (0+1)=1. Therefore, the latch value 1 is multiplied by the spacing value 16.67, and the resulting value is greater than the total delay (10) to the intermediate node B with a latch placement requirement. Therefore, latch 1 must be placed in the node with the latch placement requirement, i.e. node B. As a result, the first latch value and last latch value of node B are set 1.

Node B, being the only node in the path, is then closed. Node B's latch placement requirement met attribute is also then set to true. Then the tree graph data structure is traversed to see if any collateral nodes with latch placement requirements are satisfied. In the depicted example, it is determined that node C has its latch placement requirements met and as a result, is marked as being satisfied.

The placement of latch 1 in node B creates a clock gating condition in node B. That is, the last latch number of Node B is 1 and the clock domain for node B is 0. Thus, the last latch number is greater than the clock domain and a clock gating condition is present. As a result, the tree graph data structure is split at node B such that a new tree graph data structure is created using nodes B–I with node B being the root node of this new tree graph data structure.

Thereafter, as shown in FIG. 8, a new graph is created in which the above steps are again performed. The current process will continue on the remaining portion of the original graph. In this case the path is trivial, consisting of one node, A. The process would now look for the next highest priority node, but because there are no nodes with latch placement requirements, the process is complete.

Starting from the beginning of the new tree graph data structure with root node B, new clocking domains and total delay values are calculated in the manner described above. The maximum latch values could also be recalculated, but they would be the same as with the original tree graph data structure.

The most critical node is then identified, as discussed previously, and it is determined that node G is still the most critical node. As a result, the operation starts placing latches to satisfy node G's latch placement requirement of 2. The spacing value is now 40/((2−1)+1)=20. Latch 1 has already been placed in the operation discussed above. Therefore, the remaining placement operation starts with latch 2. The delay for the optimum placement of latch 2 is (2−1)*20=20. It is determined that node E has a total delay of 20 and thus, this makes node E the proper node in which to place the remaining latch, i.e. latch 2, in the most critical path.

Figure 9:
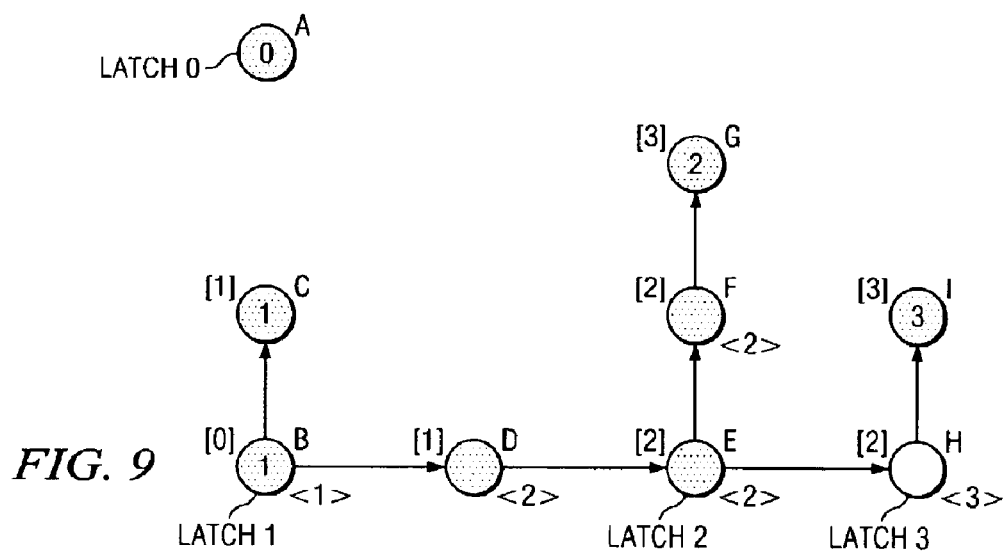

Having satisfied the latch placement requirement of the leaf node G in the most critical path, all nodes along the most critical path have their latch capability attributes set to false, causing them to be placed in a condition where additional latches cannot be placed in any of these nodes. This is represented in FIG. 9 by the shading in nodes B, D, E and F. In addition, the leaf node latch placement requirements have been met and thus, has its latch placement requirement met attribute set to true.

Thereafter, the tree graph data structure is traversed to determine if there are any nodes that have not had their latch placement requirements met. The above process is then repeated for these remaining paths with a most critical path of the remaining paths to nodes that have not had their latch placement requirements met being identified and processed in the manner discussed above.

In the depicted example, the only remaining node that does not have its latch placement requirements met is node I. As shown, node I has a latch placement requirement of 3 but only 2 latches are placed in the path from node B to node I. The only remaining node that is capable of having a latch placed in it is node H and thus, the last latch, latch 3, must be placed in node H Thereafter, the tree graph data structure is traversed to make sure that all latch placement requirements have been met and to process any additional clock gating conditions in the manner discussed above.

As a result of the above processing, it is determined that the optimum placement of transparent latches in the circuit design represented by the tree graph data structure is to have latches placed in nodes B, E and H. This placement of latches optimizes the timing and area of the circuit design with minimum clock gating situations as possible. For nodes with a numbered latch value placed in them the corresponding macro in the chip design would have latches placed in them. Odd numbered latches would be on one clock cycle phase and even numbered latches would be on the other clock cycle phase.

Figure 10:
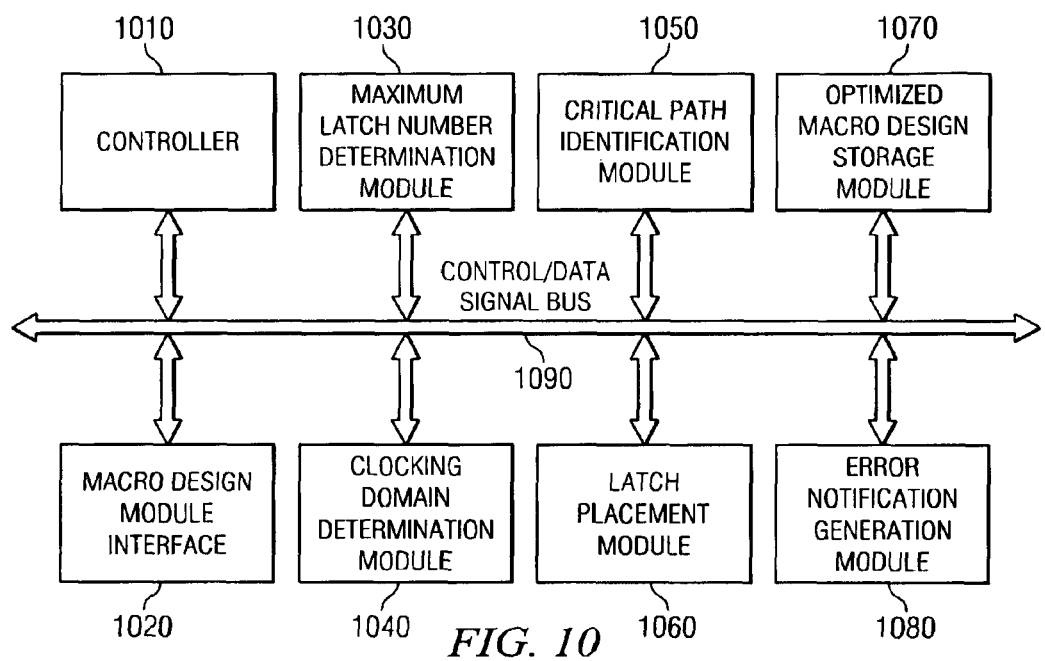
FIG. 10 is an exemplary block diagram of a transparent latch placement mechanism in accordance with the present invention.

FIG. 10 is an exemplary block diagram of the primary operational components of the present invention. The elements shown in FIG. 10 may be implemented in hardware, software, or any combination of hardware and software. In a preferred embodiment of the present invention, the elements of FIG. 10 are implemented as software instructions executed by one or more processors in one or more computing devices.

As shown in FIG. 10, the latch placement mechanism of the present invention includes a controller 1010, a macro design module interface 1020, a maximum latch number determination module 1030, a clocking domain determination module 1040, a critical path identification module 1050, a latch placement module 1060, an optimized macro design storage module 1070 and an error notification generation module 1080. The elements 1010–1080 are in communication with one another via the control/data signal bus 1090. Although a bus architecture is shown in FIG. 10, the present invention is not limited to such and any architecture that facilitates the communication of control/data signals between the elements 1010–1080 may be used without departing from the spirit and scope of the present invention.

The controller 1010 controls the overall operation of the latch placement mechanism of the present invention and orchestrates the operation of the other elements 1020–1080. The macro design module interface 1020 is the interface to the circuit design tools used to generate the circuit design. The macro design module interface 1020 is used to obtain the circuit design information used to generate the tree graph data structure, e.g., the augmented directed acyclic graph (ADAG). The controller 1010 may generate the tree graph data structure based on information obtained from the circuit design tools via the macro design module interface 1020. The tree graph data structure includes nodes that represent macros of the circuit design and edges between nodes representing data signal paths between the macros.

The maximum latch number determination module 1030 traverses the tree graph data structure and determines the maximum latch number for each node of the tree graph data structure. The clocking domain determination module 1040 traverses the tree graph data structure and determines the clocking domain for each node in the tree graph data structure. The maximum latch number and clocking domain may be stored in, or in association with, the node data structure for the corresponding node in a storage device, such as the optimized macro design storage module 1070.

The critical path identification module 1050 identifies the critical path(s) in the tree graph data structure. The critical path(s), in a preferred embodiment, are identified based on rate attributes of leaf nodes, as discussed above. The critical path(s) may be determined for the tree graph data structure and any new tree graph data structures generated in response to detection of a clock gating condition at a node.

The latch placement module 1060 is responsible for determining the optimum latch placement in view of nodal latch placement requirements of leaf nodes and intermediate nodes of the critical path. In addition, the latch placement module 1060 determines optimum placement of latches in view of the project specific placement rules defined for the particular implementation of the latch placement mechanism.

The optimized macro design storage module 1070 stores the node data structures and other information regarding the tree graph data structure. In addition, once the optimum placement of latches is determined for the tree graph data structure, this resulting optimum placement information is stored in the optimized macro design storage module 1070.

The error notification generation module 1080 is used to generate an error message or log entry for identifying conditions of latch placement that cannot be satisfied using the mechanism of the present invention. For example, in the example illustrated in FIGS. 4–9, if node B were indicated as not being able to have latches placed in it, then the latch placement requirement of node C cannot be satisfied and an error is generated. The error notifications are associated with faulty circuit design.

Thus, the present invention provides an mechanism for performing optimum transparent latch placement in a circuit design from a macro level. The latch placement of the present invention is performed automatically based on circuit design information received, and is performed such that optimum latch placement is achieved in accordance with leaf node latch placement requirements and placement rules established for the circuit design.

Figure 11:
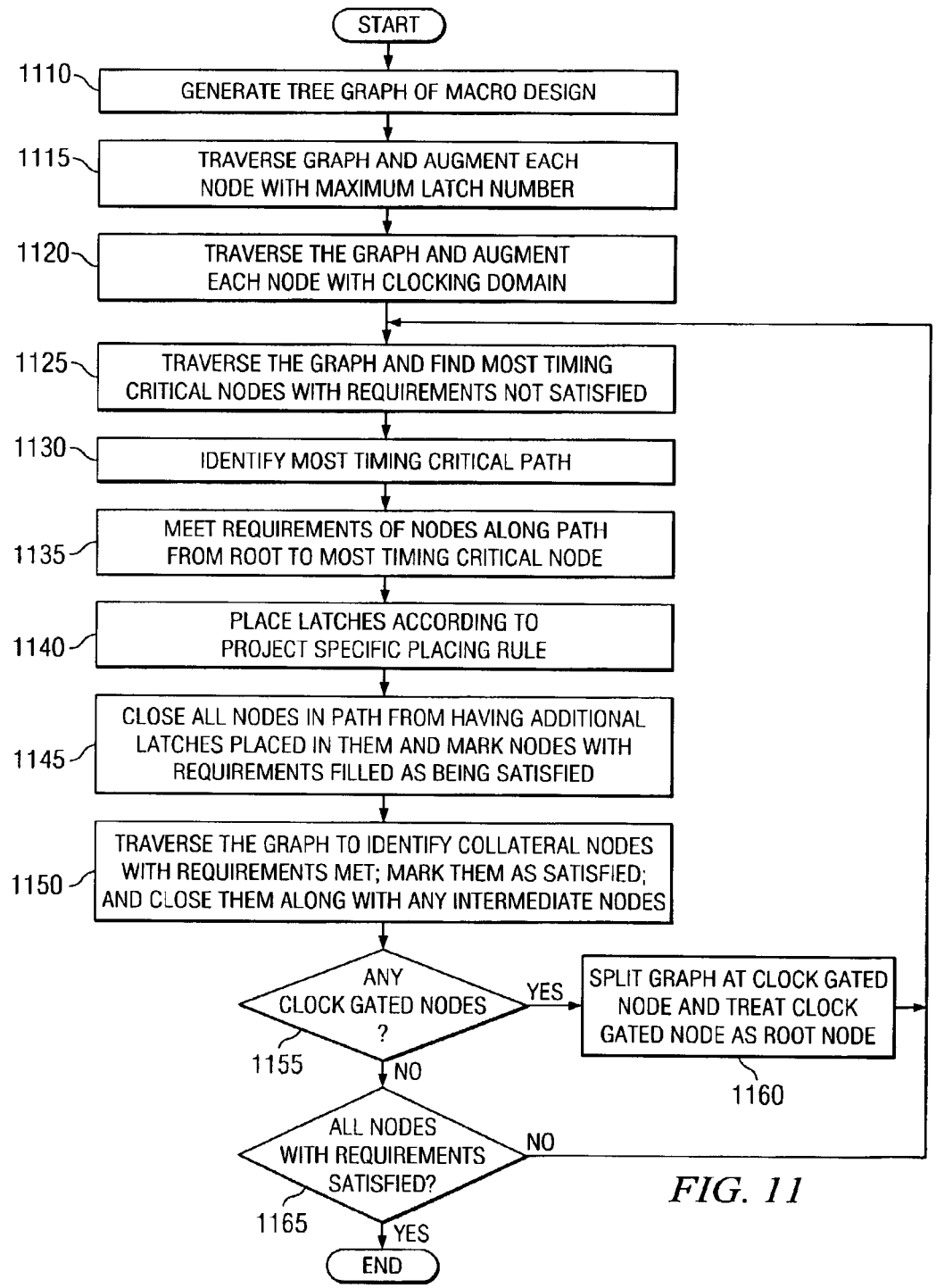
FIG. 11 is a flowchart outlining an exemplary operation of the present invention when performing transparent latch placement in a macro design.

FIG. 11 is a flowchart that illustrates a transparent latch placement operation according to the present invention. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

FIG. 11 is a flowchart outlining an exemplary operation of the present invention. As shown in FIG. 11, the operation starts by generating the tree graph data structure of the macro design (step 1110). The tree graph data structure is traversed and each node is augmented with the maximum latch number (step 1115). The tree graph data structure is then fixed if necessary and nodes of the tree graph data structure are augmented with a clocking domain (step 1120). The graph is then traversed to find the most timing critical nodes with latch placement requirements that have not been satisfied (step 1125).

The most timing critical path is then identified (step 1130) and the latch placement requirements of intermediate nodes along the path from the root to the most timing critical node are met (step 1135). Latches are then placed according to project specific placing rules (step 1140). All nodes in the path are then closed from having additional latches placed in them and nodes that have their latch placement requirements satisfied are marked as such (step 1145). The tree graph data structure is then traversed to identify any collateral nodes that have had their latch placement requirements met. These collateral nodes are also marked as having been satisfied and paths to these nodes are closed to any further latch placement (step 1150).

A determination is then made as to whether there are any clock gated nodes due to the placement of latches (step 1155). If so, the tree graph data structure is split at the clock gated node and the clock gated node is treated as the root node of the new tree graph data structure (step 1160). The operation then returns to step 1125 with the operations in steps 1125–1155 being performed with regard to this new tree graph data structure.

If no clock gated nodes are present in step 1155, then a determination is made as to whether all node with latch placement requirements have had their latch placement requirements met (step 1165). If not, the operation returns to step 1125 with regard to any remaining paths in the tree graph data structure that have latch placement requirements that need to be met. Otherwise, the operation terminates.

Thus, the present invention provides an apparatus and method for performing transparent latch placement in a macro design in an automated fashion taking into consideration latch placement requirements of macros, latch placement capabilities of macros, and latch placement rules associated with the macro design. The present invention provides an optimized placement of latches in a macro design to optimize timing and/or area of the overall circuit design.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMS, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a computing device, of optimizing latch placement in a macro based chip design, comprising:
    generating a tree graph data structure at the macro based chip design;
    determining a most critical path in the tree graph data structure, wherein the most critical path is between a root node of the tree graph data structure and a most critical node of the tree graph data structure that does not have a latch placement requirement met; and
    performing latch placement on the most critical node of the most critical path in accordance with the latch placement requirement of the most critical node and any latch placement requirements of intermediate nodes in the most critical path.

2. The method of claim 1, wherein each node of the tree graph data structure has an associated node data structure that includes attributes of a corresponding node.

3. The method of claim 2, wherein the attributes of the corresponding node include at least one of a latch capability attribute, a first latch number attribute, a last latch number attribute, a delay attribute, a total delay attribute, a required number of latches attribute, a rate attribute, a requirement met attribute, a maximum latch number attribute, and a clocking domain attribute.

4. The method of claim 1, wherein determining the most critical path includes:
    comparing rate attributes of nodes in the tree graph data structure; and
    determining the most critical path to be a path from a root node of the tree graph data structure to a node of the tree graph data structure that has a rate attribute that is a one of a largest value and a smallest value.

5. The method of claim 4, wherein the rate attribute is a ratio of a total delay to thy node and the required number of latches to be placed for the node.

6. The method of claim 1, further comprising:
    determining if leaf nodes in the tree graph data structure have latch placement requirements and the leaf nodes cannot have latches placed within the leaf nodes, thereby identifying the leaf nodes as closed leaf node; and
    propagating the latch placement requirements of closed leaf nodes to parent nodes of the closed leaf nodes.

7. The method of claim 1, wherein performing latch placement includes:
    determining a spacing value such that a total delay of the critical path is evenly divided between a required number of latches to be placed in the critical path; and
    placing latches in the critical path in accordance with the spacing value.

8. The method of claim 7, wherein placing latches in the critical path in accordance with the spacing value includes:
    placing latches up to the latch placement requirement of the critical node by placing the latches in nodes that have a total delay attribute that is closest to a multiple of the spacing value compared to remaining nodes in the critical path.

9. The method of claim 8, wherein placing the latches having a total delay attribute that is closest to a multiple of the spacing value includes using project specific rules to select between nodes when none of the nodes in the critical path have a total delay attribute whose value is an exact multiple of the spacing value.

10. The method of claim 1, wherein performing latch placement includes:
    determining if there are any clock gatings due to placement of latches in the tree graph data structure;
    splitting the tree graph data structure at a clock gated node if a clock gating is determined to exist to thereby generate a second tree graph data structure; and
    performing latch placement on a critical path of the second tree graph data structure.

11. The method of claim 1, further comprising:
    identifying a next most critical path in the tree graph data structure; and performing latch placement on the next most critical path in the tree graph data structure.

12. The method of claim 1, wherein performing latch placement includes:
   satisfying intermediate node latch placement requirements of intermediate nodes in the critical path prior to satisfying the latch placement requirement of the critical node.

13. A computer program product in a computer readable medium for optimizing latch placement in a macro based chip design, comprising:
   first instructions for generating a tree graph data structure of the macro based chip design;
   second instructions for determining a most critical path in the tree graph data structure, wherein the most critical path is between a root node of the tree graph data structure and a most critical node of the tree graph data structure that does not have a latch placement requirement met; and
   third instructions for performing latch placement on the most critical node of the most critical path in accordance with the latch placement requirement of the most critical node and any latch placement requirements of intermediate nodes in the most critical path.

14. The computer program product of claim 13, wherein each node of the tree graph data structure has an associated node data structure that includes attributes of a corresponding node.

15. The computer program product of claim 14, wherein the attributes of the corresponding node include at least one of a latch capability attribute, a first latch number attribute, a last latch number attribute, a delay attribute, a total delay attribute, a required number of latches attribute, a rate attribute, a requirement met attribute, a maximum latch number attribute, and a clocking domain attribute.

16. The computer program product of claim 13, wherein the second instructions for determining the most critical path include:
   instructions for comparing rate attributes of nodes in the tree graph data structure; and
   instructions for determining the most critical path to be a path from a root node of the tree graph data structure to a node of the tree graph data structure that has a rate attribute that is a one of a largest value and a smallest value.

17. The computer program product of claim 16, wherein the rate attribute is a ratio of a total delay to the node and the required number of latches to be placed for the node.

18. The computer program product of claim 13, further comprising:
   fourth instructions for determining if leaf nodes in the tree graph data structure have latch placement requirements and the leaf nodes cannot have latches placed within the leaf nodes, thereby identifying the leaf nodes as closed leaf node; and
   fifth instructions for propagating the latch placement requirements of closed leaf nodes to parent nodes of the closed leaf nodes.

19. The computer program product of claim 13, wherein the third instructions for performing latch placement include:
   instructions for determining a spacing value such that a total delay of the critical path is evenly divided between a required number of latches to be placed in the critical path; and
   instructions for placing latches in the critical path in accordance with the spacing value.

20. The computer program product of claim 19, wherein the instructions for placing latches in the critical path in accordance with the spacing value include:
   instructions for placing latches up to the latch placement requirement of the critical node by placing the latches in nodes that have a total delay attribute that is closest to a multiple of the spacing value compared to remaining nodes in the critical path.

21. The computer program product of claim 20, wherein the instructions for placing the latches having a total delay attribute that is closest to a multiple of the spacing value include instructions for using project specific rules to select between nodes when none of the nodes in the critical path have a total delay attribute whose value is an exact multiple of the spacing value.

22. The computer program product of claim 13, wherein the third instructions for performing latch placement include:
   instructions for determining if there are any clock gatings due to placement of latches in the tree graph data structure;
   instructions for splitting the tree graph data structure at a clock gated node if a clock gating is determined to exist to thereby generate a second tree graph data structure; and
   instructions for performing latch placement on a critical path of the second tree graph data structure.

23. The computer program product of claim 13, further comprising:
   fourth instructions for identifying a next most critical path in the tree graph data structure; and
   fifth instructions for performing latch placement on the next most critical path in the tree graph data structure.

24. The computer program product of claim 13, wherein the third instructions for performing latch placement includes:
   instructions for satisfying intermediate node latch placement requirements of intermediate nodes in the critical path prior to satisfying the latch placement requirement of the critical node.

25. An apparatus for optimizing latch placement in a macro based chip design, comprising:
   means for generating a tree graph data structure of the macro based chip design;
   means for determining a most critical path in the tree graph data structure, wherein the most critical path is between a root node of the tree graph data structure and a most critical node of the tree graph data structure that does not have a latch placement requirement met; and
   means for performing latch placement on the most critical node of the most critical path in accordance with the latch placement requirement of the most critical node and any latch placement requirements of intermediate nodes in the most critical path.

26. The apparatus of claim 25, wherein the means for determining the most critical path includes:
   means for comparing rate attributes of nodes in the tree graph data structure; and means for determining the most critical path to be a path from a root node of the tree graph data structure to a node of the tree graph data structure that has a rate attribute that is a one of a largest value and a smallest value.

27. The computer program product of claim 25, further comprising:
   means for determining if leaf nodes in the tree graph data structure have latch placement requirements and the leaf nodes cannot have latches placed within the leaf node, thereby identifying the leaf nodes as closed leaf nodes; and means for propagating the latch placement requirements of closed leaf nodes to parent nodes of the closed leaf nodes.

28. The apparatus of claim 25, wherein the means for performing latch placement includes:

means for determining a spacing value such that a total delay of the critical path is evenly divided between a required number of latches to be placed in the critical path; and means for placing latches in the critical path in accordance with the spacing value.

29. The apparatus of claim 28, wherein the means for placing latches in the most critical path in accordance with the spacing value includes:

means for placing latches up to the latch placement requirement of the most critical node by placing the latches in nodes that have a total delay attribute that is closest to a multiple of the spacing value compared to remaining nodes in the critical path.

30. The apparatus of claim 29, wherein the means for placing the latches having a total delay attribute that is closest to a multiple of the spacing value includes means for using project specific rules to select between nodes when none of the nodes in the critical path have a total delay attribute whose value is an exact multiple of the spacing value.

31. The apparatus of claim 25, wherein the means for performing latch placement includes:

means for determining if there are any clock gatings due to placement of latches in the tree graph data structure;

means for splitting the tree graph data structure at a clock gated node if a clock gating is determined to exist to thereby generate a second tree graph data structure; and means for performing latch placement on a critical path of the second tree graph data structure.

32. The apparatus of claim 25, further comprising:

means for identifying a next most critical path in the tree graph data structure; and means for performing latch placement on the next most critical path in the tree graph data structure.

* * * * *